US011227994B2

(12) United States Patent
Wei et al.

(10) Patent No.: US 11,227,994 B2
(45) Date of Patent: Jan. 18, 2022

(54) NON-VOLATILE MEMORY CELL, NON-VOLATILE MEMORY CELL ARRAY, AND METHOD OF MANUFACTURING THE SAME

(71) Applicant: HEFEI RELIANCE MEMORY LIMITED, Hefei (CN)

(72) Inventors: Zhiqiang Wei, Pleasanton, CA (US); Zhichao Lu, San Jose, CA (US)

(73) Assignee: Hefei Reliance Memory Limited, Hefei (CN)

(*) Notice: Subject to any disclaimer, the term of this patent is extended or adjusted under 35 U.S.C. 154(b) by 72 days.

(21) Appl. No.: 16/669,391

(22) Filed: Oct. 30, 2019

(65) Prior Publication Data

US 2020/0395539 A1   Dec. 17, 2020

Related U.S. Application Data

(60) Provisional application No. 62/862,307, filed on Jun. 17, 2019.

(51) Int. Cl.
*H01L 45/00* (2006.01)
*H01L 27/24* (2006.01)
*G11C 13/00* (2006.01)

(52) U.S. Cl.
CPC ...... *H01L 45/1206* (2013.01); *G11C 13/0002* (2013.01); *H01L 27/2436* (2013.01); *H01L 45/124* (2013.01); *H01L 45/1253* (2013.01); *H01L 45/145* (2013.01); *H01L 45/16* (2013.01)

(58) Field of Classification Search
CPC .......................... H01L 45/1253; H01L 45/124
See application file for complete search history.

(56) References Cited

U.S. PATENT DOCUMENTS

| | | | | |
|---|---|---|---|---|
| 9,806,255 B1* | 10/2017 | Hsu | ........................ | H01L 45/146 |
| 2014/0061573 A1* | 3/2014 | Mikawa | .............. | H01L 45/1253 257/4 |
| 2014/0252295 A1* | 9/2014 | Liao | .................... | H01L 27/2463 257/2 |
| 2015/0171142 A1 | 6/2015 | Kawashima et al. | | |
| 2016/0020390 A1* | 1/2016 | Chang | ..................... | H01L 45/08 257/4 |
| 2018/0269389 A1 | 9/2018 | Hsu et al. | | |
| 2019/0058109 A1 | 2/2019 | Chen et al. | | |
| 2021/0074917 A1* | 3/2021 | Su | ......................... | H01L 45/146 |

OTHER PUBLICATIONS

PCT International Search Report and the Written Opinion dated Aug. 25, 2020, issued in related International Application No. PCT/US2020/036832 (9 pages).

* cited by examiner

*Primary Examiner* — Grant S Withers
(74) *Attorney, Agent, or Firm* — Sheppard Mullin Richter & Hampton LLP

(57) ABSTRACT

A non-volatile memory cell includes a bottom electrode, a top electrode having a conductive material, a resistive layer interposed between the bottom electrode and the top electrode, and side portions covering sides of the top electrode and the resistive layer. The side portions contain an oxide of the conductive material. The non-volatile memory cell further includes a contact wire disposed on the top electrode. A width of the contact wire is less than a width between lateral outer surfaces of the side portions.

19 Claims, 14 Drawing Sheets

Prior Art

NON-VOLATILE MEMORY CELL, NON-VOLATILE MEMORY CELL ARRAY, AND METHOD OF MANUFACTURING THE SAME

CROSS REFERENCE TO RELATED APPLICATIONS

This application claims benefits of U.S. provisional application No. 62/862,307 filed Jun. 17, 2019, entitled "NON-VOLATILE MEMORY CELL, NON-VOLATILE MEMORY CELL ARRAY, AND METHOD OF MANUFACTURING THE SAME," the content of which is incorporated by reference herein in its entirety.

TECHNICAL FIELD

The disclosure relates generally to memory cells and methods of manufacturing memory cells, and more specifically to non-volatile memory cells, non-volatile memory cell arrays, and methods of manufacturing the same.

BACKGROUND

Memory devices are included in many electronic devices, such as cell phones, computers, cars, display devices, etc. Memory devices have been utilized to store data for various purposes. Generally, memory devices include two types of memory depending on whether the data stored therein is retained or erased after power is cut off. In volatile memory devices, the data is wiped out every time the power to the volatile memory devices are turned off. Whereas data stored in a non-volatile memory device is retained even after the power is turned off.

A non-volatile memory device generally includes a memory array that has tens of thousands of memory cells. FIG. 1 is a schematic diagram illustrating a conventional memory cell 100 for a non-volatile memory device. The memory cell 100 includes a bottom electrode 102, a top electrode 104, a dielectric layer 106 interposed between the bottom electrode 102 and the top electrode 104, and a metal line 108 connected to the top electrode 104. The bottom electrode 102 and the top electrode 104 generally include conductive materials, while the dielectric layer 106 generally contains an oxide. This conventional memory cell 100 has several drawbacks. For example, due to the structure, short circuits may be induced between the metal line 108 and the dielectric layer 106 or between the metal line 108 and the bottom electrode 102. The short circuits would damage or impede the memory cell 100 from its normal functions. Further, the oxygen of the dielectric layer 106 may escape to other portions of the memory cell 100, degrading its functions.

FIG. 2 is a schematic diagram illustrating another conventional memory cell 200 for a non-volatile memory device. The memory cell 200 includes a bottom electrode 202, a top electrode 204, a dielectric layer 206 interposed between the bottom electrode 202 and the top electrode 204, a top metal line 208 connected to the top electrode 204, a bottom metal line 210 connected to the bottom electrode 202, and an insulating layer 212 disposed between the bottom metal line 210 and the dielectric layer 206. The insulating layer 212 insulates the bottom electrode 202 and reduces the possibility of a short circuit between the top metal line 208 and the bottom electrode 202. However, it is still likely that the top metal line 208 may have a short circuit with the dielectric layer 206. Also, the oxygen of the dielectric layer 206 may escape to other portions of the memory cell 200, reducing the reliability of the memory cell 200.

SUMMARY

One aspect of the present disclosure is directed to a non-volatile memory cell. The non-volatile memory cell includes a bottom electrode, a top electrode having a conductive material, a resistive layer interposed between the bottom electrode and the top electrode, and side portions covering sides of the top electrode and the resistive layer. The side portions contain an oxide of the conductive material. The non-volatile memory cell further includes a contact wire disposed on the top electrode. A width of the contact wire is less than a width between lateral outer surfaces of the side portions.

In some embodiments, the non-volatile memory cell further includes an insulating layer disposed on the side portions and side walls covering the outer surfaces of the side portions and the insulating layer. Lateral surfaces of the contact wire are in contact with the insulating layer and the side walls.

In some embodiments, a portion of a bottom surface of the contact wire and a portion of lateral surfaces of the contact wire are in contact with the side portions. In some embodiments, the width of the contact wire is greater than a width of the top electrode.

In some embodiments, the bottom electrode includes at least one of TiN, TaN, or W. In some embodiments, the top electrode includes at least one of TiN, TaN, or Ru. In some embodiments, the resistive layer includes a metal oxide. In some embodiments, the resistive layer includes a first film and a second film disposed on the first film, the second film being different from the first film. The first film includes a first metal oxide. The second film includes a second metal oxide. In some embodiments, the side portions further include an oxide of the resistive layer. In some embodiments, the bottom electrode is disposed in a via hole and connected to a metal line.

Another aspect of the present disclosure is directed to a method to form a non-volatile memory cell. A first dielectric layer is formed on a first metal line. The first dielectric layer is etched to form a first via hole to reach the first metal line. A bottom electrode is formed in the first via hole. A resistive layer, a top electrode, and a second dielectric layer are formed on the bottom electrode and the first dielectric layer. The resistive layer and the top electrode are oxidized to form side portions covering sides of the top electrode and the resistive layer. A side wall layer is formed to cover the second dielectric layer and the side portions. A second via hole penetrating the side wall layer and the second dielectric layer is formed to reach the top electrode. A contact wire is formed in the second via hole such that a width of the contact wire is less than a width between lateral outer surfaces of the side portions.

These and other features of the apparatuses, systems, and methods, disclosed herein, as well as the methods of operation and functions of the related elements of structure, will become more apparent upon consideration of the following description and the appended claims with reference to the accompanying drawings, all of which form a part of this specification. It is to be expressly understood, however, that the drawings are for purposes of illustration and description only and are not intended as a definition of the limits of the disclosure. It is to be understood that the foregoing general description and the following detailed description are exemplary and explanatory only, and are not restrictive of the disclosure, as claimed.

BRIEF DESCRIPTION OF THE DRAWINGS

Non-limiting embodiments of the disclosure may be more readily understood by referring to the following drawings.

DETAILED DESCRIPTION OF EMBODIMENTS

Non-limiting embodiments of the present disclosure will now be described with reference to the drawings. It should be understood that particular features and aspects of any embodiment disclosed herein may be used and/or combined with particular features and aspects of any other embodiment disclosed herein. It should also be understood that such embodiments are by way of example and are merely illustrative of a small number of embodiments within the scope of the present disclosure. Various changes and modifications obvious to one skilled in the art to which the present disclosure pertains are deemed to be within the spirit, scope and contemplation of the present disclosure as further defined in the appended claims.

Techniques disclosed herein provide memory cells that can overcome the drawbacks of the conventional memory cell. Solutions provided by the following embodiments can simplify manufacturing procedures and are compatible with logic processes. The memory devices adopting the disclosed memory cells retain stable memory performance that increase the reliability of the devices.

Figure 1:
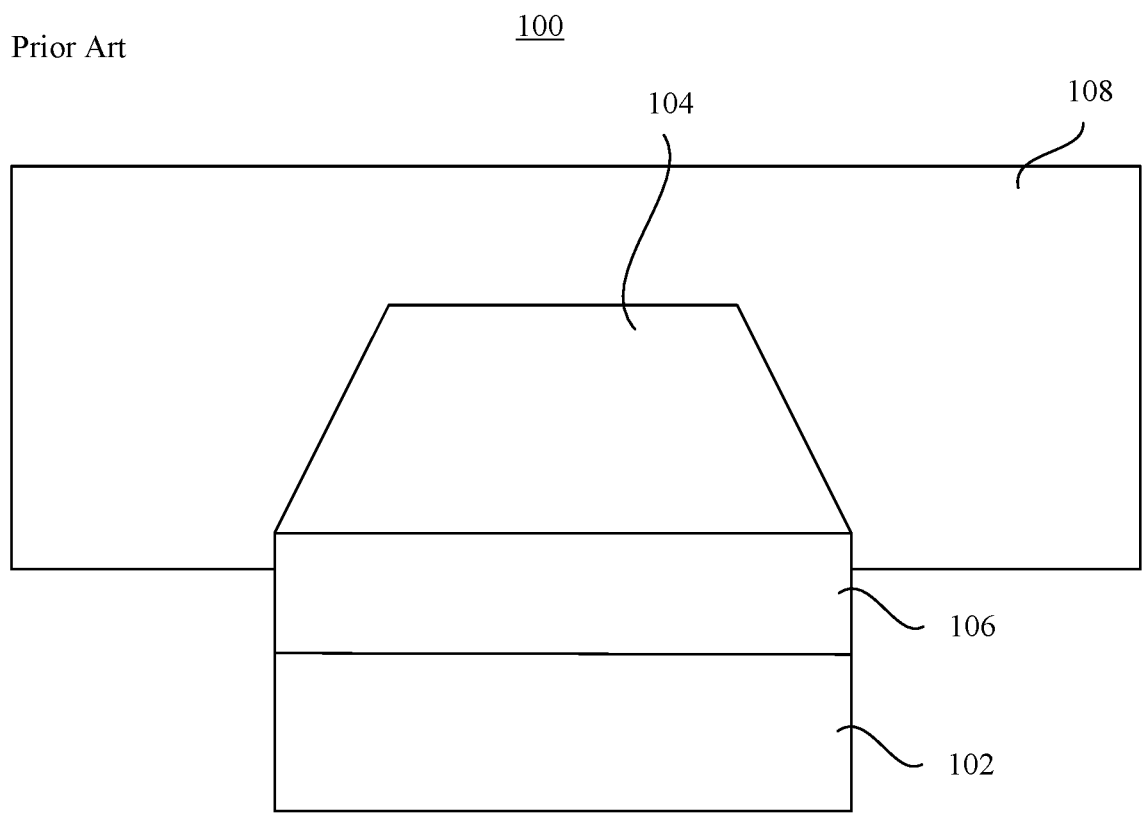
FIG. 1 is a schematic diagram illustrating a conventional memory cell for a non-volatile memory device.
Figure 2:
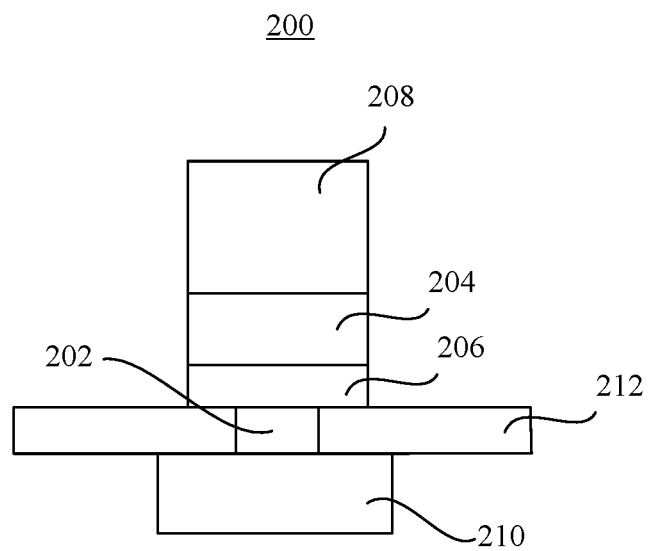
FIG. 2 is a schematic diagram illustrating another conventional memory cell for a non-volatile memory device.
Figure 3A:
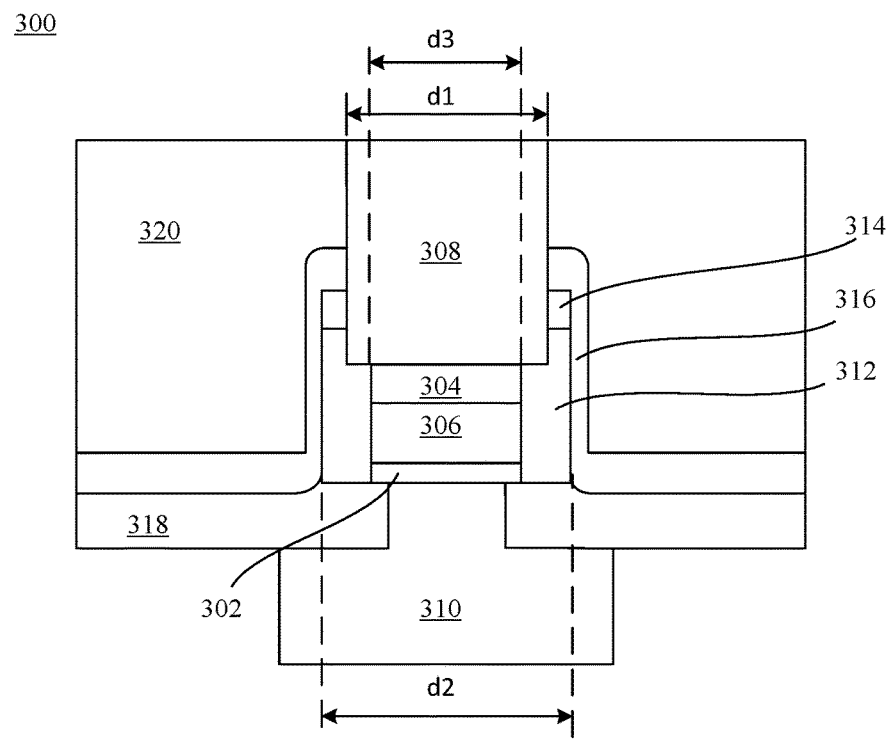
FIG. 3A is a schematic diagram illustrating a cross-section view of a memory cell along the X direction, according to one example embodiment.
Figure 3B:
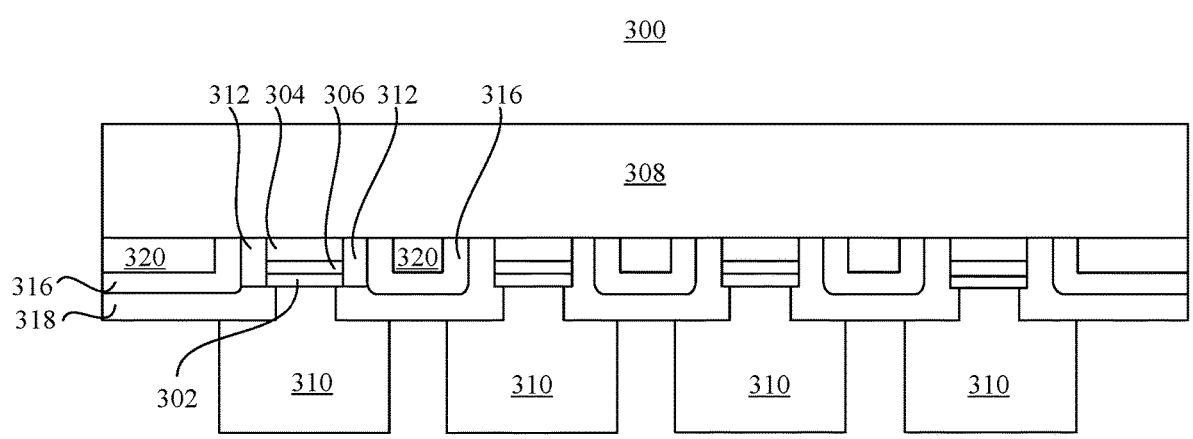
FIG. 3B is a schematic diagram illustrating a cross-section view of the memory cell shown in FIG. 3A along the Y direction, according to one example embodiment.

Embodiments will now be explained with accompanying figures. Reference is first made to FIGS. 3A and 3B. FIG. 3A is a schematic diagram illustrating a cross-section view of a memory cell 300 along the X direction, according to one example embodiment. FIG. 3B is a schematic diagram illustrating a cross-section view of the memory cell 300 along the Y direction, according to one example embodiment. The memory cell 300 includes a bottom electrode 302, a top electrode 304, a dielectric layer 306 interposed between the bottom electrode 302 and the top electrode 304, a top contact wire 308 connected to the top electrode 304, and a bottom contact wire 310 connected to the bottom electrode 302. Side portions 312 are provided to cover the sides of the bottom electrode 302, the top electrode 304, and the dielectric layer 306. An insulating layer 314 is disposed on the side portions 312. Side walls 316 are provided to cover the outer surfaces of the side portions 312 and the insulating layer 314. A bottom insulating layer 318 is disposed under the bottom electrode 302 and is provided to insulate the bottom contact wire 310. A top insulating layer 320 is disposed on the side walls 316 and is provided to insulate the top contact wire 308. As shown in FIG. 3B, two adjacent stacks of the bottom electrode 302, the top electrode 304, and the dielectric layer 306 are separated in the Y direction by the side walls 316 and the top insulating layer 320.

In some embodiments, the bottom electrode 302 includes at least one of TiN, TaN, W, or other suitable conductive materials. In some embodiments, the top electrode 304 includes at least one of TiN, TaN, Ru, Pt, Ir, W, and other suitable conductive materials. The dielectric layer 306 may be a resistive layer containing a resistive material. For example, the dielectric layer 306 may include one or more resistive metal oxides, such as $Ta_2O_5$, $TaO_x$, $WO_x$, $TiO_x$, $ZrO_x$ etc. In some embodiments, the resistive layer 306 may include one or more films. For example, the resistive layer 306 may have a first film and a second film disposed on the first film. The second film is different from the first film. In some embodiments, the first film includes a first metal oxide, and the second film includes a second metal oxide.

The top contact wire 308 and the bottom contact wire 310 may include conductive materials, such as metals. Example contact wires include Cu, Al, Au, Pt, W, etc. The side portions 312 at least include an oxide of the conductive material included in the top electrode 304. In some embodiments, the side portions 312 may further include an oxide of the resistive layer 306. In some embodiments, the side portions 312 may further include an oxide of the bottom electrode 302.

The insulating layer 314 may include SiON, SiN, $SiO_x$, CSiNH, CSiOH, or other insulting materials. The side walls 316 may include $SiO_2$, $Si_3N_4$, TEOS, CSiNH, etc. The side walls 316 extends to cover a top surface of the insulating layer 314 and a top surface of the bottom insulating layer 318. The top contact wire 308 has a width d1 that is less than a width d2 between lateral outer surfaces of the side portions 312. The width d1 of the top contact wire 308 is greater than a width d3 of the top electrode 304. A portion of a bottom surface of the top contact wire 308 and a portion of lateral surfaces of the top contact wire 308 are in contact with the side portions 312. Further, lateral surfaces of the top contact wire 308 are in contact with the insulating layer 314 and the side walls 316.

In the illustrated embodiments, the lateral/side surfaces of the bottom electrode 302, the top electrode 304, and the resistive layer 306 are covered with insulating side portions 312, which substantially reduce the possibility of a short circuit between the top contact wire 308 and the resistive layer 306, and between the top contact wire 308 and the bottom electrode 302. Moreover, the side portions 312 that cover the lateral/side surfaces of the resistive layer 306 effectively prohibit oxygen diffusion from the resistive layer 306 into other portions of the memory cell 300. These structures improve the performance and reliability of the memory cell 300. Particularly, the retention capability of the memory cell 300 may be improved.

Figure 4A:
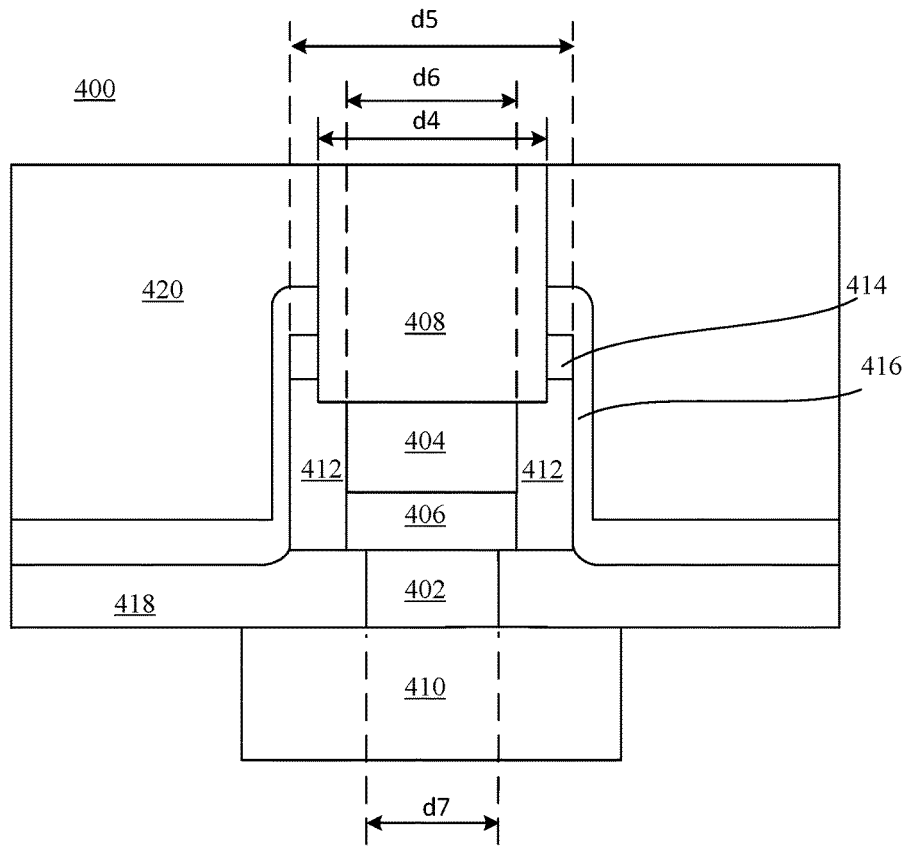
FIG. 4A is a schematic diagram illustrating a cross-section view of another memory cell along the X direction, according to one example embodiment.
Figure 4B:
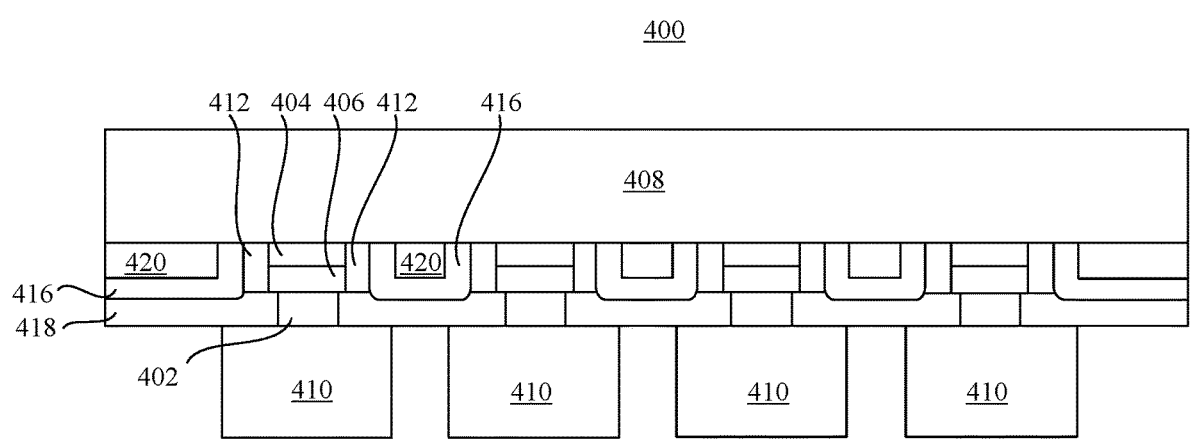
FIG. 4B is a schematic diagram illustrating a cross-section view of the memory cell as shown in FIG. 4A along the Y direction, according to one example embodiment.

FIG. 4A is a schematic diagram illustrating a cross-section view of another memory cell 400 along the X direction, according to one example embodiment. FIG. 4B is a schematic diagram illustrating a cross-section view of the memory cell 400 along the Y direction, according to one example embodiment. The memory cell 400 includes a bottom electrode 402, a top electrode 404, a dielectric/resistive layer 406 interposed between the bottom electrode 402 and the top electrode 404, a top contact wire 408 connected to the top electrode 404, and a bottom contact wire 410 connected to the bottom electrode 402. Side portions 412 are provided to cover the sides of the top electrode 404 and the dielectric layer 406. An insulating layer 414 is disposed on the side portions 412. Side walls 416 are provided to cover the outer surfaces of the side portions 412 and the insulating layer 414. A bottom insulating layer 418 is disposed on the bottom contact wire 410 and is provided to insulate the bottom electrode 402. A top insulating layer 420 is disposed on the side walls 416 and is provided to insulate the top contact wire 408. As shown in FIG. 4B, two adjacent stacks of the bottom electrode 402, the top electrode 404, and the dielectric layer 406 are separated in the Y direction by the side walls 416 and the top insulating layer 420.

The memory cell 400 is similar to the memory cell 300 shown in FIGS. 3A and 3B, except that the bottom electrode 402 is disposed in a via hole in the bottom insulating layer 418 and connected to the bottom contact wire 410. In the memory cell 400, the side portions 412 at least include an oxide of the conductive material included in the top electrode 404. In some embodiments, the side portions 412 may further include an oxide of the resistive layer 406. In the illustrated embodiment, the side portions 412 may not include an oxide of the bottom electrode 402.

The top contact wire 408 has a width d4 that is less than a width d5 between lateral outer surfaces of the side portions 412. The width d4 of the top contact wire 408 is greater than a width d6 of the top electrode 404. The bottom electrode 402 has a width d7 that is less than the width d6 of the top electrode 404 or the resistive layer 406.

The lateral/side surfaces of the top electrode 404 and the resistive layer 406 are covered with insulating side portions 412, which reduce the possibility of a short circuit between the top contact wire 408 and the resistive layer 406. Further, the bottom electrode 402 is embedded in a via hole of the bottom insulating layer 418, which reduces the possibility of a short circuit between the top contact wire 408 and the bottom electrode 402. Moreover, the side portions 412 that cover the lateral/side surfaces of the resistive layer 406 effectively prohibit oxygen diffusion from the resistive layer 406 into other portions of the memory cell 400. These structures improve the performance and reliability of the memory cell 400.

Figure 5A:
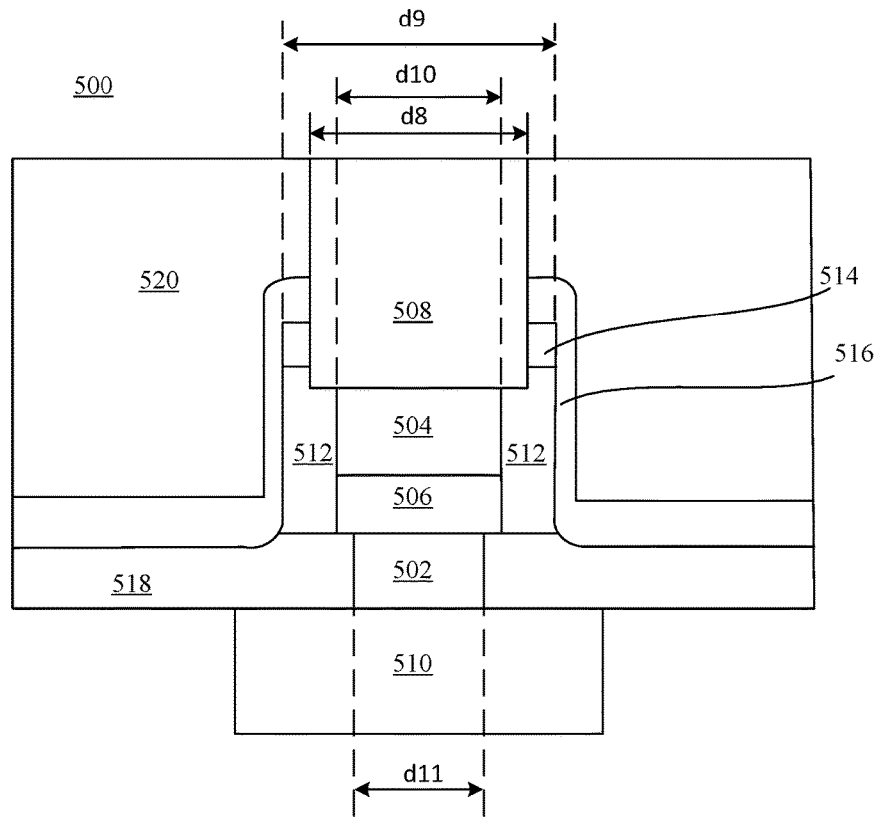
FIG. 5A is a schematic diagram illustrating a cross-section view of another memory cell along the X direction, according to one example embodiment.
Figure 5B:
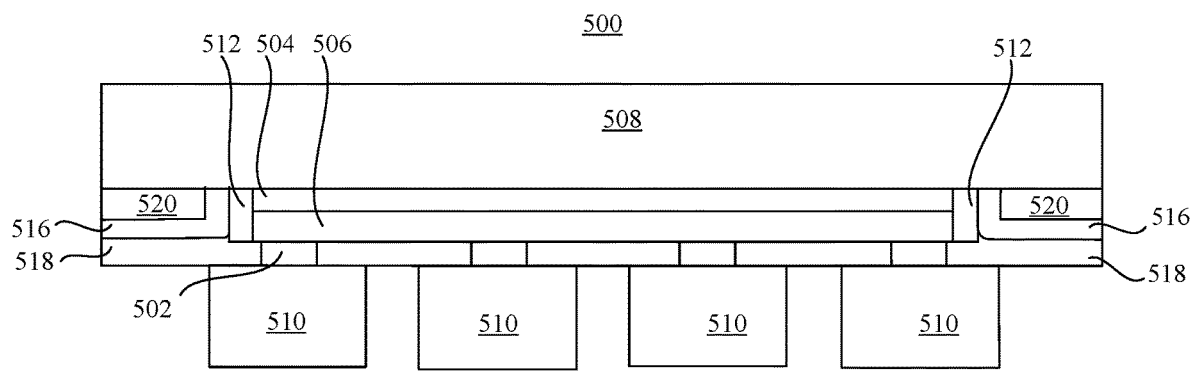
FIG. 5B is a schematic diagram illustrating a cross-section view of the memory cell as shown in FIG. 5A along the Y direction, according to one example embodiment.

FIG. 5A is a schematic diagram illustrating a cross-section view of another memory cell 500 along the X direction, according to one example embodiment. FIG. 5B is a schematic diagram illustrating a cross-section view of the memory cell 500 along the Y direction, according to one example embodiment. The memory cell 500 includes a bottom electrode 502, a top electrode 504, a dielectric/resistive layer 506 interposed between the bottom electrode 502 and the top electrode 504, a top contact wire 508 connected to the top electrode 504, and a bottom contact wire 510 connected to the bottom electrode 502. Side portions 512 are provided to cover the sides of the top electrode 504 and the dielectric layer 506. An insulating layer 514 is disposed on the side portions 512. Side walls 516 are provided to cover the outer surfaces of the side portions 512 and the insulating layer 514. A bottom insulating layer 518 is disposed on the bottom contact wire 510 and is provided to insulate the bottom electrode 502. A top insulating layer 520 is disposed on the side walls 516 and is provided to insulate the top contact wire 508.

As shown in FIG. 5B, the resistive layer 506 and the top electrode 504 are formed as a line structure along the Y direction connecting a plurality of memory cells 500. Each of the bottom electrodes 502 are separated by the bottom insulating layer 518.

Similar to the memory cell 400 in FIGS. 4A and 4B, in the X direction, the top contact wire 508 has a width d8 that is less than a width d9 between lateral outer surfaces of the side portions 512. The width d8 of the top contact wire 508 is greater than a width d10 of the top electrode 504. The bottom electrode 502 has a width d11 that is less than the width d8 of the top electrode 504 or the resistive layer 506.

The lateral/side surfaces of the top electrode 504 and the resistive layer 506 are covered with insulating side portions 512, which reduce the possibility of a short circuit between the top contact wire 508 and the resistive layer 506. The bottom electrode 502 is embedded in a via hole of the bottom insulating layer 518, which reduces the possibility of a short circuit between the top contact wire 508 and the bottom electrode 502. Moreover, the side portions 512 that cover the lateral/side surfaces of the resistive layer 506 effectively prohibit oxygen diffusion from the resistive layer 506 into other portion of the memory cell 500. These structures improve the performance and reliability of the memory cell 500.

Figure 6:
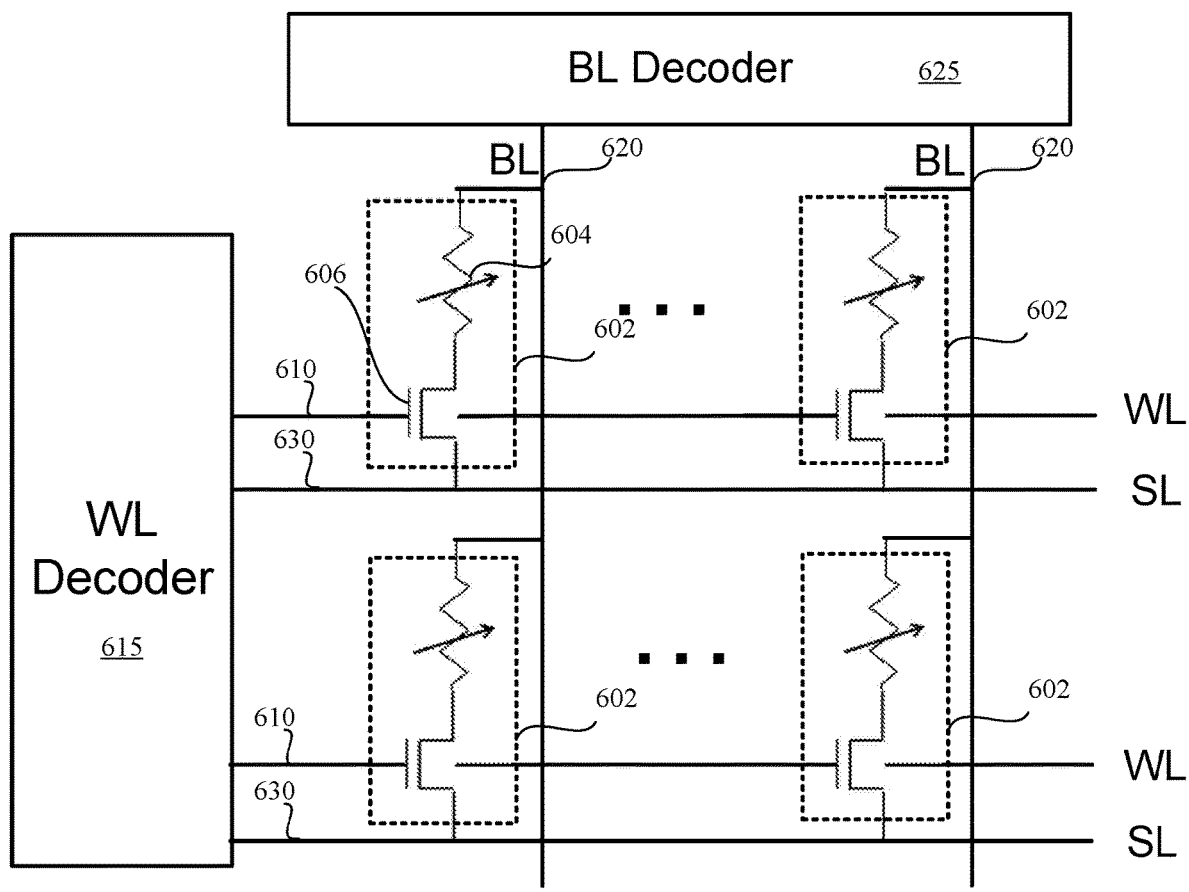
FIG. 6 shows a portion of a memory array that includes memory cells consistent with the present disclosure, according to one example embodiment.

The memory cells disclosed herein can be used to form a memory array for a memory device. FIG. 6 shows a portion of a memory array 600 that includes memory cells consistent with the present disclosure, according to one example embodiment. The memory array 600 includes a plurality of memory cells 602. Each of the memory cell may include a resistive element 604 and a transistor 606. The memory array 600 is arranged in a cross-point configuration having word lines 610 and bit lines 620. The word lines 610 and the bit lines 620 extend orthogonally to each other. A resistance memory cell 602 is located at each intersection of a word line 610 and a bit line 620. The word lines 610 are coupled to a word line decoder 615, which selects one of the word lines connected to a corresponding row of the resistance memory cells 602. The bit lines 620 are coupled to a bit line decoder 625, which selects one of the bit lines connected to a corresponding column of the resistance memory cells 602. The memory array 600 further includes a plurality of source lines 630 extending in parallel with the word lines 610. In some embodiments, the source lines 630 may instead extend in parallel with the bit lines 620.

A gate of the transistor 606 is connected to a word line 610. A source terminal of the transistor 606 is connected to a source line 630, and a drain terminal of the transistor 606 is connected to one terminal of a resistive element 604. Another terminal of the resistive element 604 is connected to a bit line 620. The resistance memory cell 602 at the intersection of the selected word line and the selected bit line is subject to a read, reset, or set operation, depending on the duration, magnitude and polarity of respective voltage pulses applied across the resistance memory cell 602 via the selected word line 610 and the selected bit line 620.

A memory array that includes the memory cells consistent with the above descriptions may be applied to various electric devices and systems. For example, the memory array may be part of a microcontroller unit, a radio-frequency identification system, etc.

Figure 7:
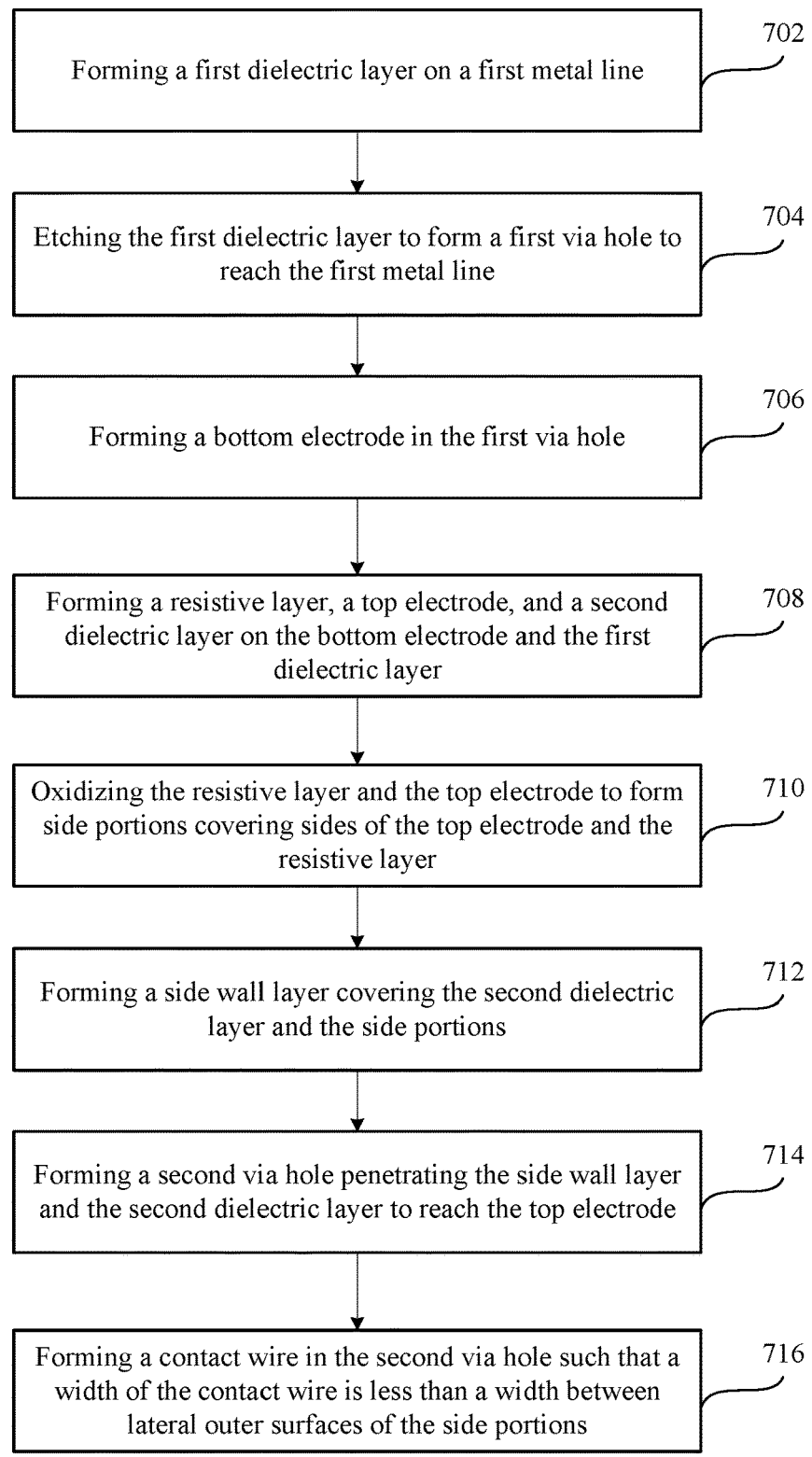
FIG. 7 is a flow chart illustrating a method for forming a memory cell, according to one embodiment.

Methods for forming a memory cell consistent with the above embodiments will now be explained with reference to FIG. 7. FIG. 7 is a flow chart illustrating a method 700 for forming a memory cell, according to one embodiment. At 702, a first dielectric layer is formed on a first metal line. At 704, the first dielectric layer is etched to form a first via hole to reach the first metal line. At 706. a bottom electrode is formed in the first via hole. At 708, a resistive layer, a top electrode, and a second dielectric layer are formed on the bottom electrode and the first dielectric layer. At 710, the resistive layer and the top electrode are oxidized to form side portions covering sides of the top electrode and the resistive layer. At 712, a side wall layer is formed to cover the second dielectric layer and the side portions. At 714, a second via hole penetrating the side wall layer and the second dielectric layer is formed to reach the top electrode. At 716, a contact wire is formed in the second via hole such that a width of the contact wire is less than a width between lateral outer surfaces of the side portions.

Figure 8A:
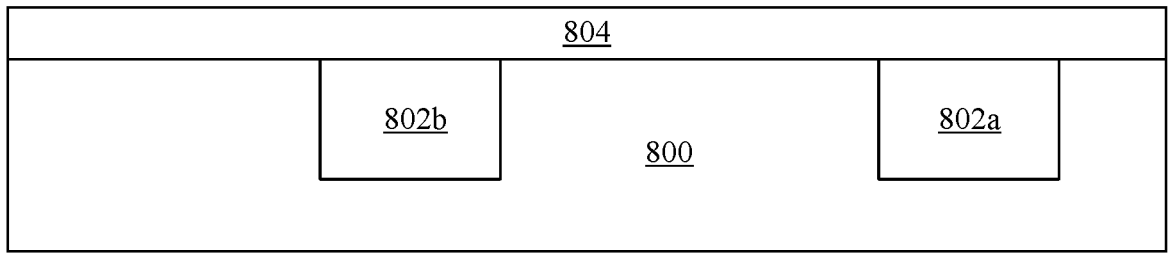
FIGS. 8A-8W are schematic diagrams illustrating process flows for forming a memory cell, according to various example embodiments.

Another method for forming a memory cell consistent with the above embodiments is further explained with reference to FIGS. 8A-8W. FIGS. 8A-8W are schematic diagrams illustrating process flows for forming a memory cell, according to various example embodiments. Reference is first made to FIG. 8A. A plurality of bottom metal lines 802 including metal lines 802a and 802b are formed on a substrate 800. Although not shown in FIG. 8A, the substrate 800 may include other circuits for controlling memory cells. A first dielectric layer 804 is then deposited on the bottom metal lines 802 and the substrate 800. The first dielectric layer 804 may include silicon oxide, silicon nitride, silicon oxynitride, or other insulating materials. The first dielectric layer 804 may be deposited using physical vapor deposition or chemical vapor deposition methods.

Figure 8B:
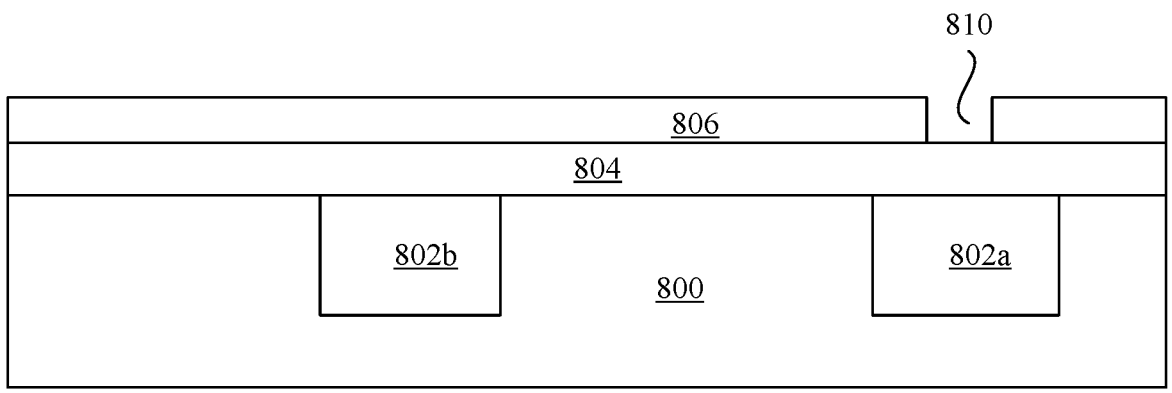
Figure 8C:
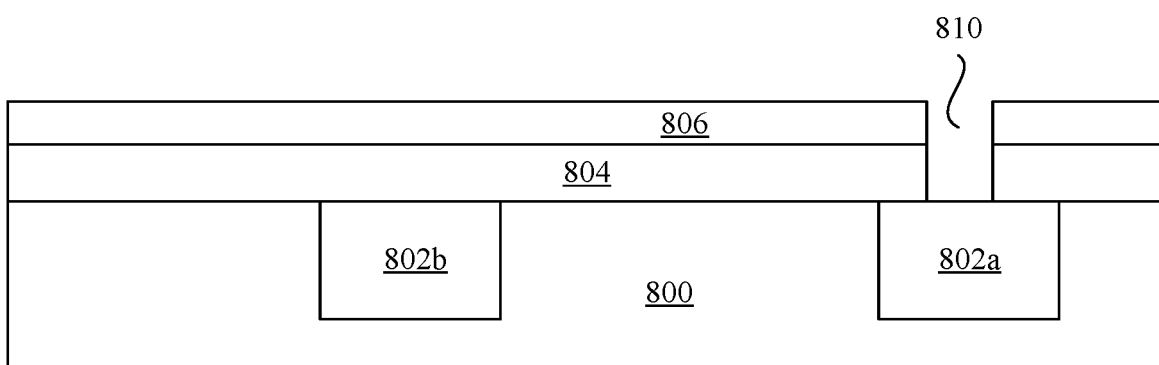
Figure 8D:
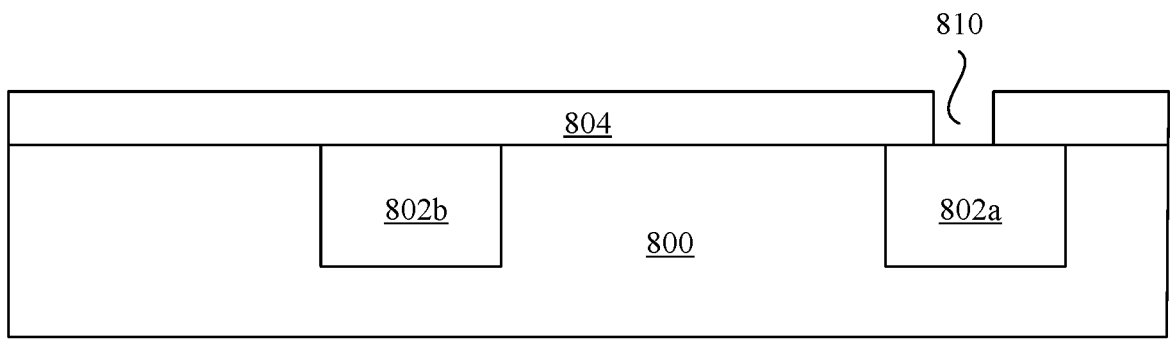
Figure 8E:
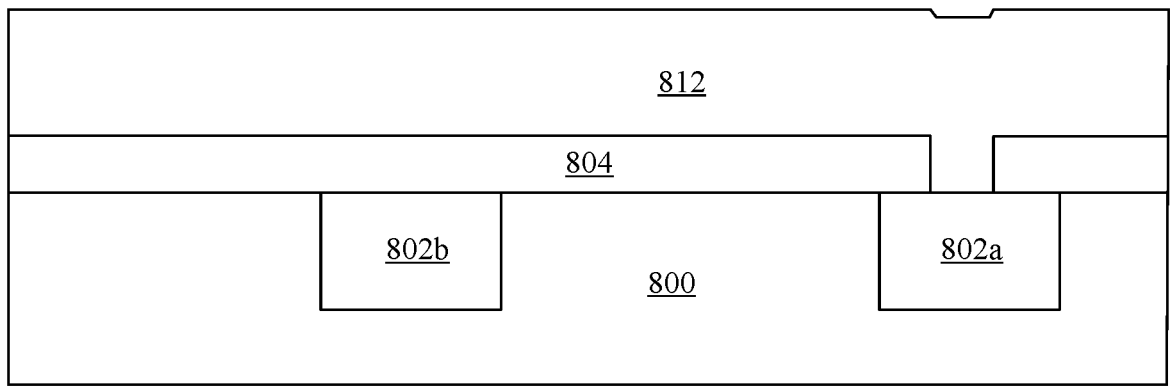
Figure 8F:
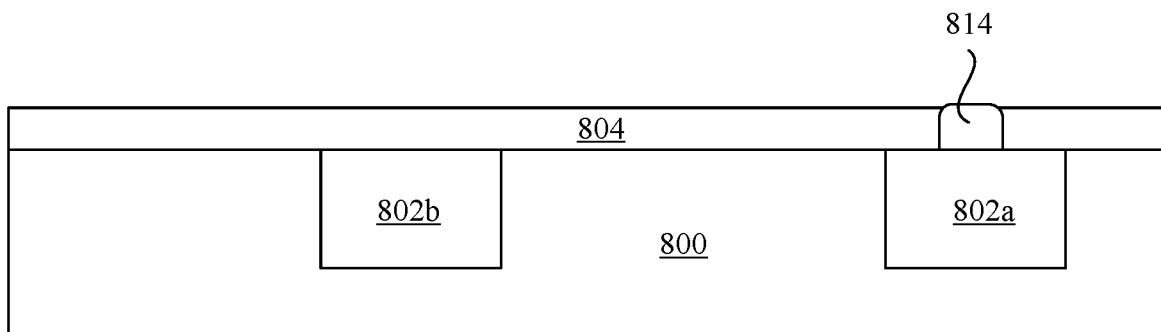

Referring to FIG. 8B, a photoresist 806 is deposited on the first dielectric layer 804. A photolithographic step is performed on the photoresist 806 to form an opening 810 in the photoresist 806 that exposes a surface of the first dielectric layer 804. Referring to FIG. 8C, the first dielectric layer 804 is etched at the opening 810 to reach a surface of the bottom metal lines 802. The photoresist 806 is removed from the upper surface of the first dielectric layer 804 to form a first via hole 810 (FIG. 8D). Then a conductive layer 812 is deposited on the first dielectric layer 804 and in the first via hole 810 (FIG. 8E). A chemical-mechanism polishing (CMP) method is employed to remove the conductive layer 812 from the surface of the first dielectric layer 804, leaving the conductive layer 812 in the first via hole 810 (FIG. 8F). The conductive layer 812 in the via hole forms a bottom electrode 814 for a non-volatile memory cell.

Figure 8G:
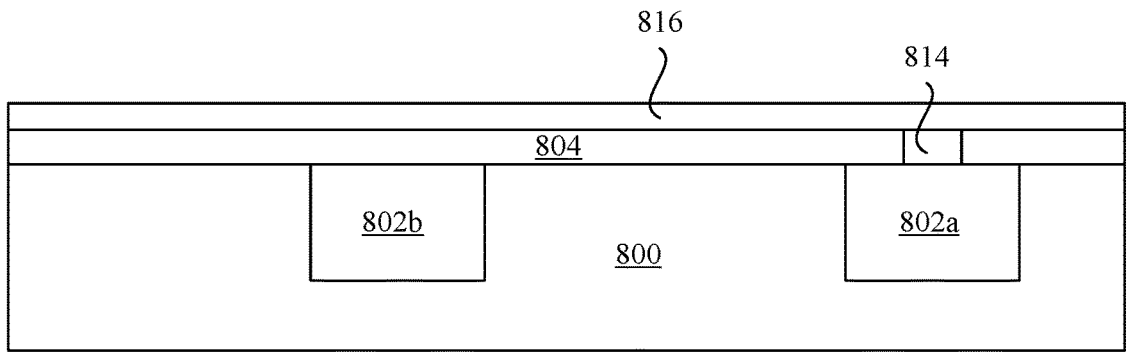
Figure 8H:
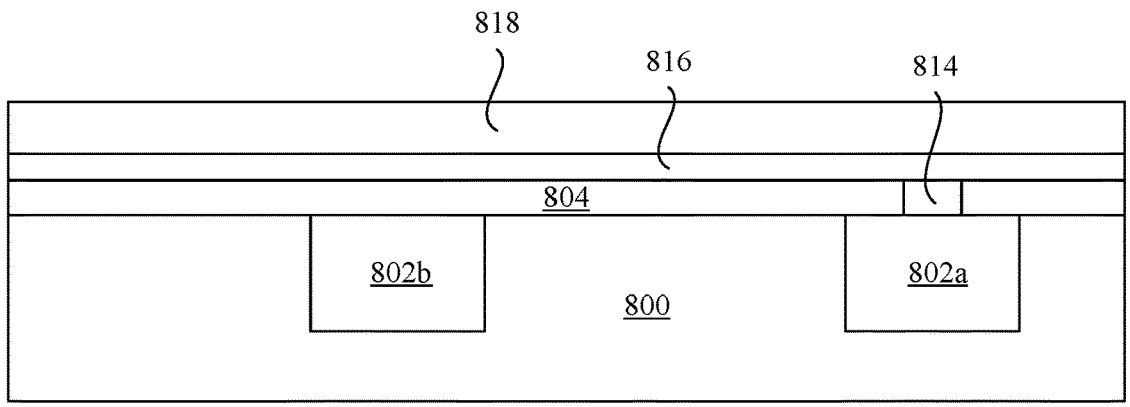
Figure 8I:
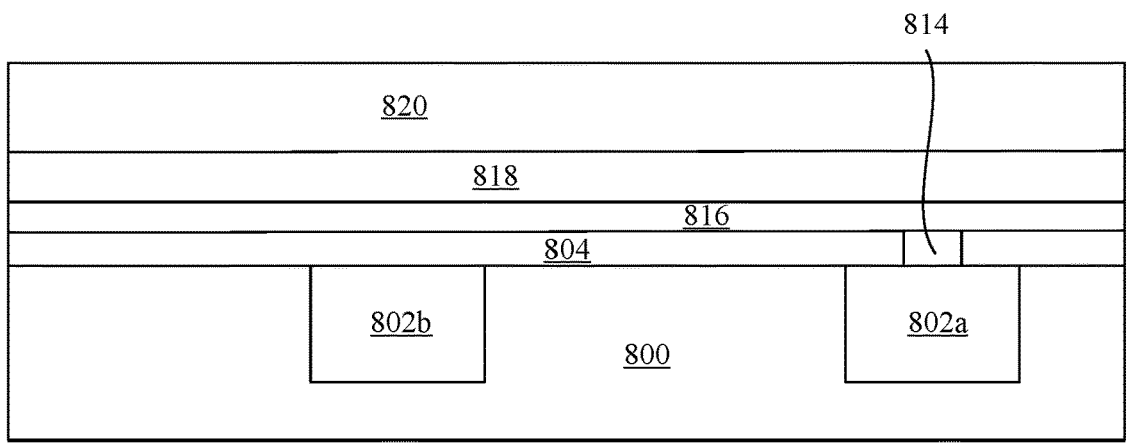
Figure 8J:
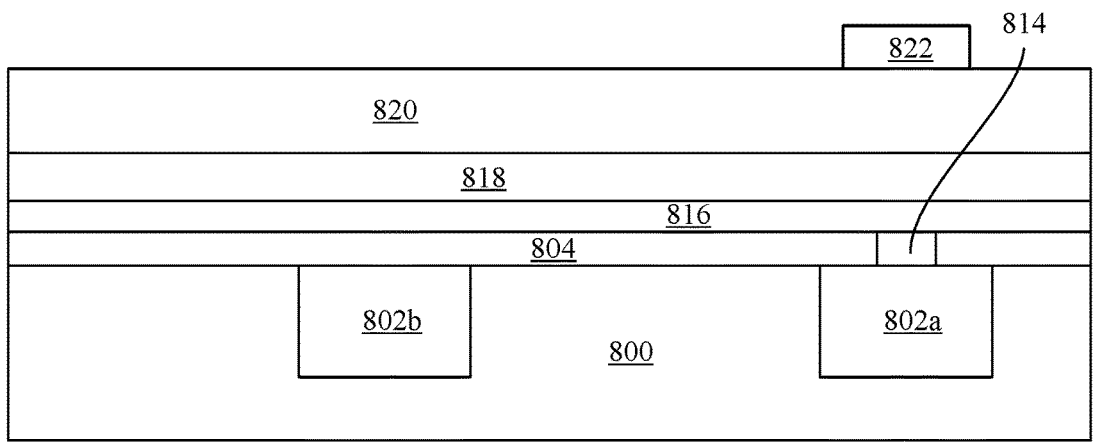

Next, referring to FIG. 8G, a resistive layer 816 containing one or more metal oxides ($MO_x$) is deposited on the structures shown in FIG. 8F. In some embodiments, the resistive layer 816 may include one or more resistive metal oxides, such as $Ta_2O_5$, $TaO_x$, etc. In some embodiments, the resistive layer 816 may include one or more films. For example, the resistive layer 816 may have a first film and a second film disposed on the first film. The second film is different from the first film. In some embodiments, the first film includes a first metal oxide, and the second film includes a second metal oxide. For example, a first film of $Ta_2O_5$ is first deposited on the bottom electrode 814 and the first dielectric layer 804. Then a second film of $TaO_x$ is deposited on the first film. A conductive layer 818 is then deposited on the resistive layer 816 (FIG. 8H), which is followed by a deposition of a second dielectric layer 820 on the conductive layer 818 (FIG. 8I). A photoresist is then coated on the second dielectric layer 820 and patterned to form a photoresist pattern 822 (FIG. 8J). In some embodiments, patterning the photoresist may be performed using the metal lines 802a as a mask such that the photoresist pattern 822 is aligned with the metal lines 802a in the width direction.

Figure 8K:
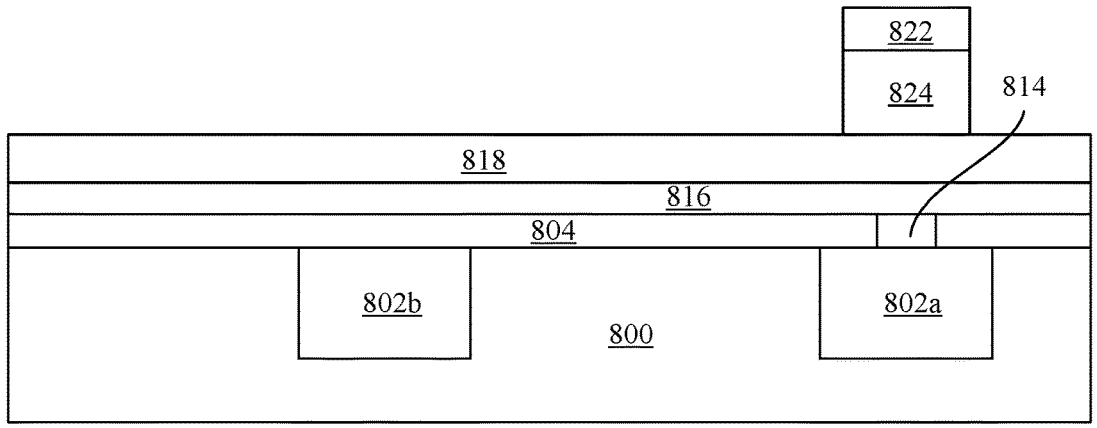
Figure 8L:
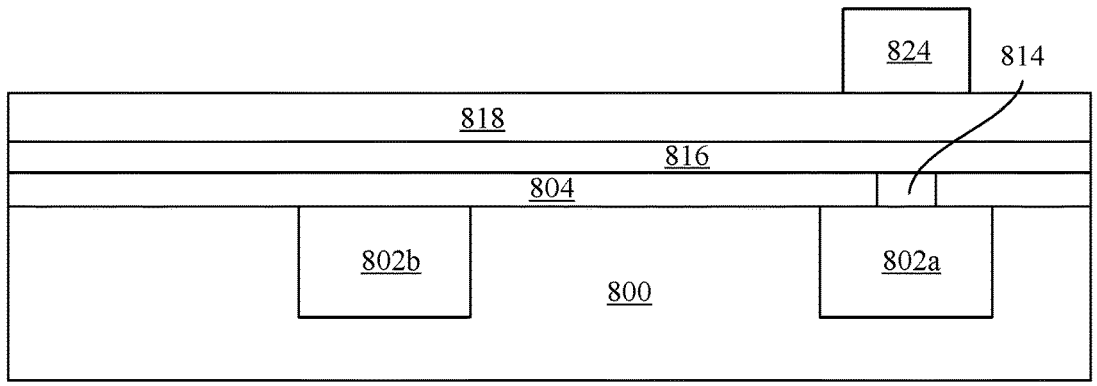
Figure 8M:
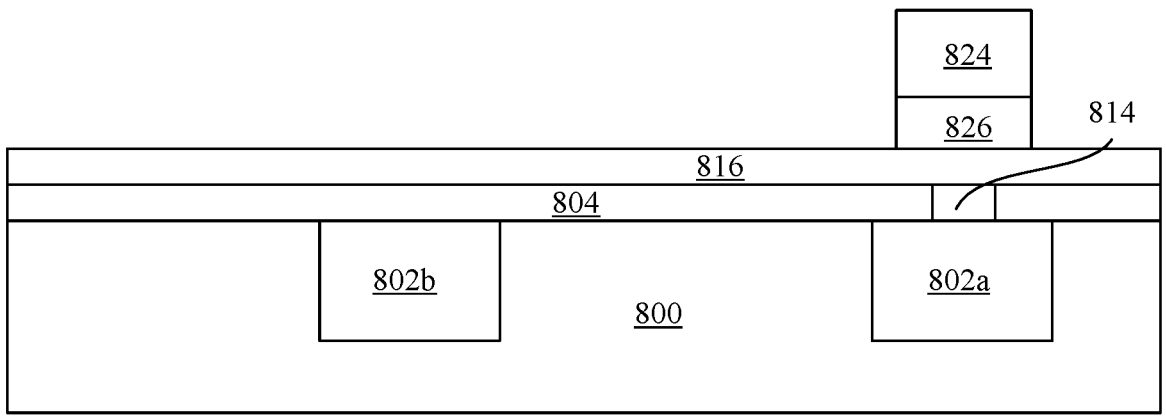
Figure 8N:
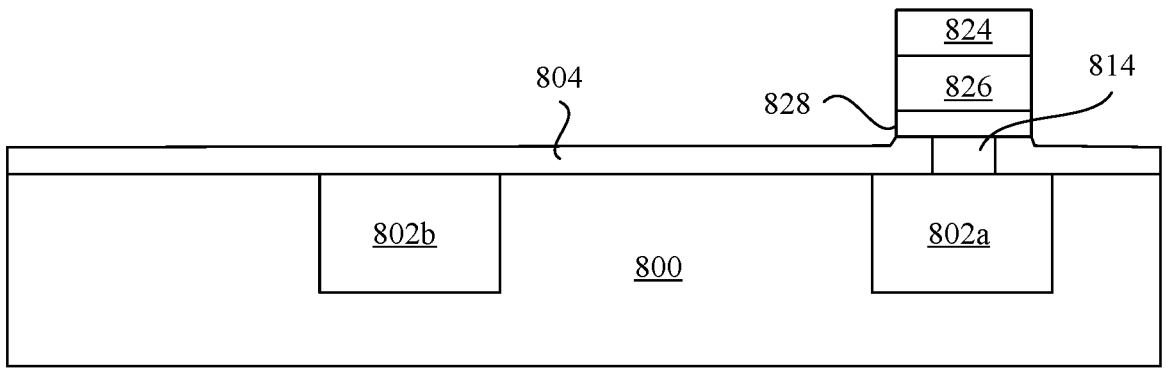

The second dielectric layer 820 is etched with the photoresist pattern 822 to form a residue second dielectric layer 824 (FIG. 8K). The photoresist pattern 822 is then stripped to expose the second dielectric layer 824 (FIG. 8L). In some embodiments, the photoresist pattern 822 is stripped by a photoresist ashing method. For example, a plasma source may be employed to generate a reactive species, e.g., oxygen or fluorine. The reactive species reacts with the photoresist pattern 822 to form ash, which is removed with a vacuum pump. Next, the conductive layer 818 is etched using the second dielectric layer 824 as a mask to form a top electrode 826 for the memory cell (FIG. 8M). Afterwards, the resistive layer 816 is etched also using the second dielectric layer 824 as a mask to form a residue resistive layer 828 (FIG. 8N).

Figure 8O:
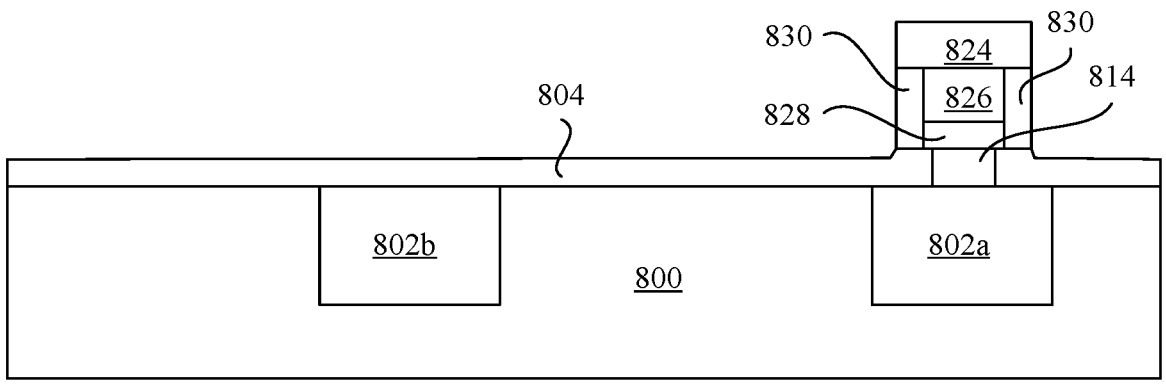

Referring to FIG. 8O, the top electrode 826 and the resistive layer 828 are subject to an oxidizing process to form side portions 830 covering sides of the top electrode 830 and the resistive layer 828. The side portions 830 at least include an oxide of a conductive material of the top electrode 830. In some embodiments, the side portions 830 may further include an oxide of the resistive layer 828.

Figure 8P:
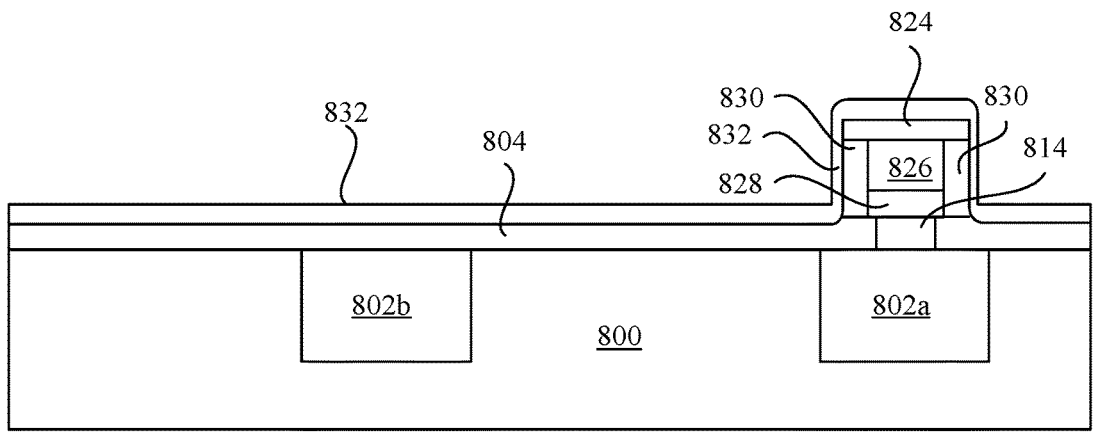
Figure 8Q:
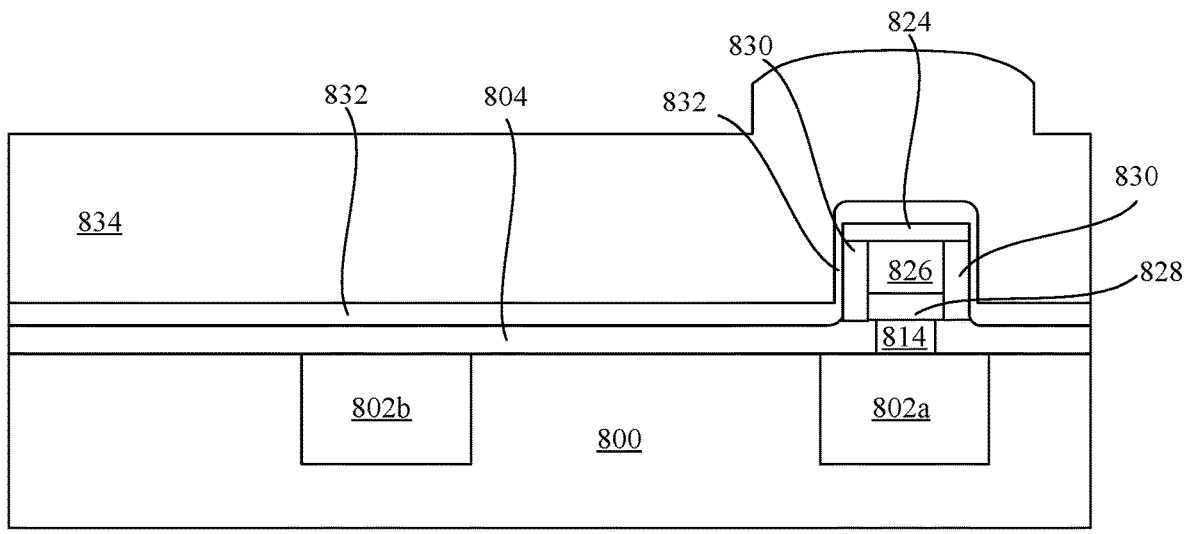
Figure 8R:
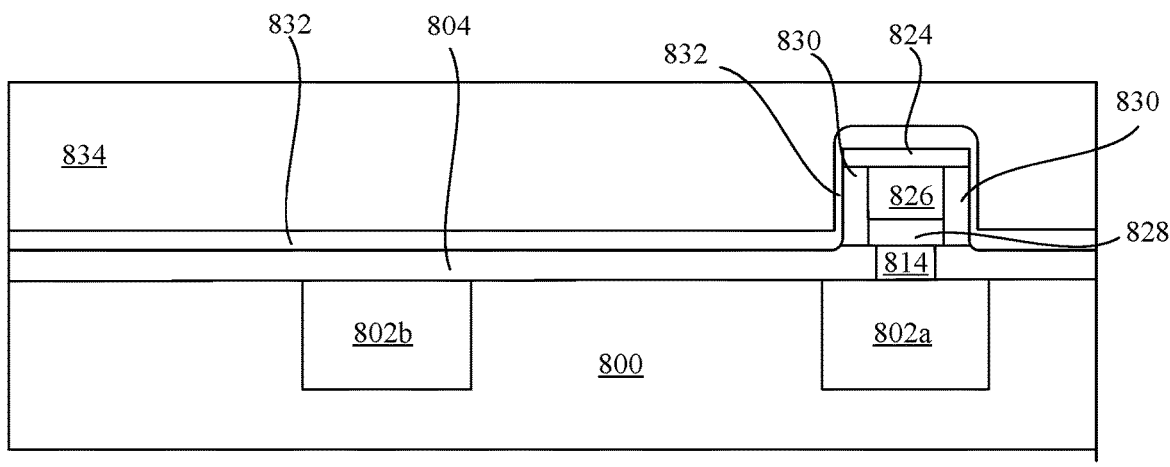

After the oxidation process, a side wall layer 832 is deposited on the substrate 800 to cover the second dielectric layer 824, the side portions 830, and the first dielectric layer 804 (FIG. 8P). In some embodiments, the side wall layer 832 includes a silicon oxide. For example, tetraethoxysilane (TEOS) may be employed to form the side wall layer 832. In some embodiments, a thick insulating layer 834 is then deposited on the side wall layer 832 (FIG. 8Q). In some embodiments, the insulating layer 834 may be formed with TEOS or other suitable insulating materials. The uneven surface of the insulating layer 834 is then flattened by a CMP method (FIG. 8R).

Figure 8S:
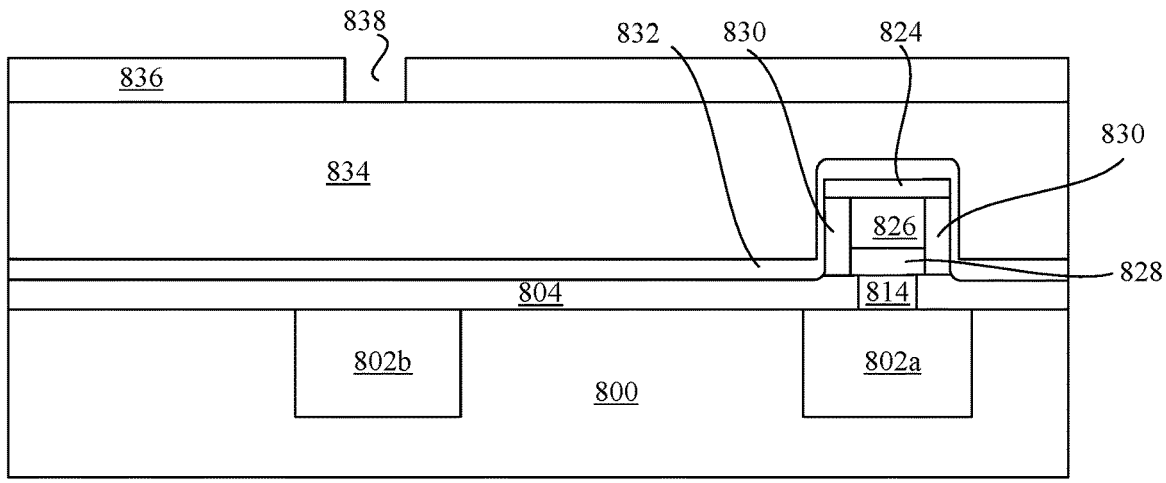
Figure 8T:
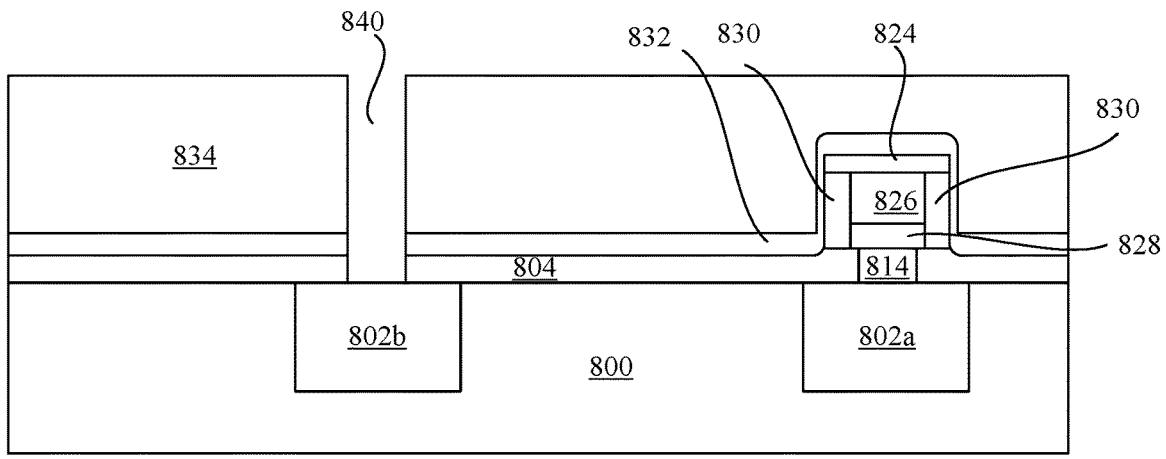
Figure 8U:
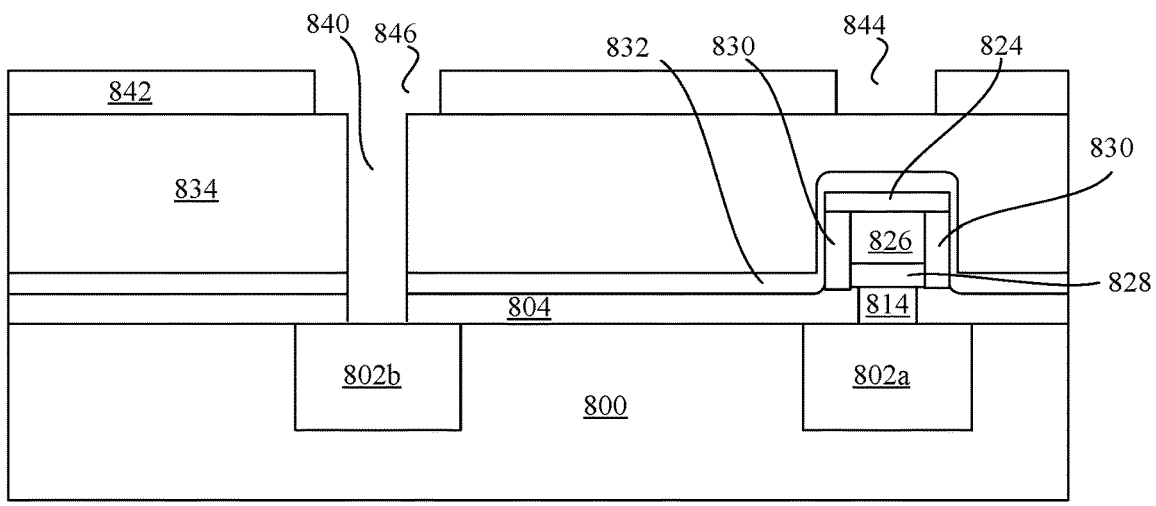

A photoresist 836 is then coated on the flat surface of the insulating layer 834 and patterned to open a hole 838 in the insulating layer 834 that corresponds to the metal line 802b (FIG. 8S). The insulating layer 834, the side wall layer 832, and the first dielectric layer 804 are patterned at the hole 838 of the photoresist 836 to form a trench 840 that exposes a surface of the metal line 802b, and the residue photoresist 836 is then stripped (FIG. 8T). Another photoresist 842 is then coated on the substrate 800 and patterned to form two openings 844 and 846 corresponding to the top electrode 826 and the trench 840, respectively (FIG. 8U).

Figure 8V:
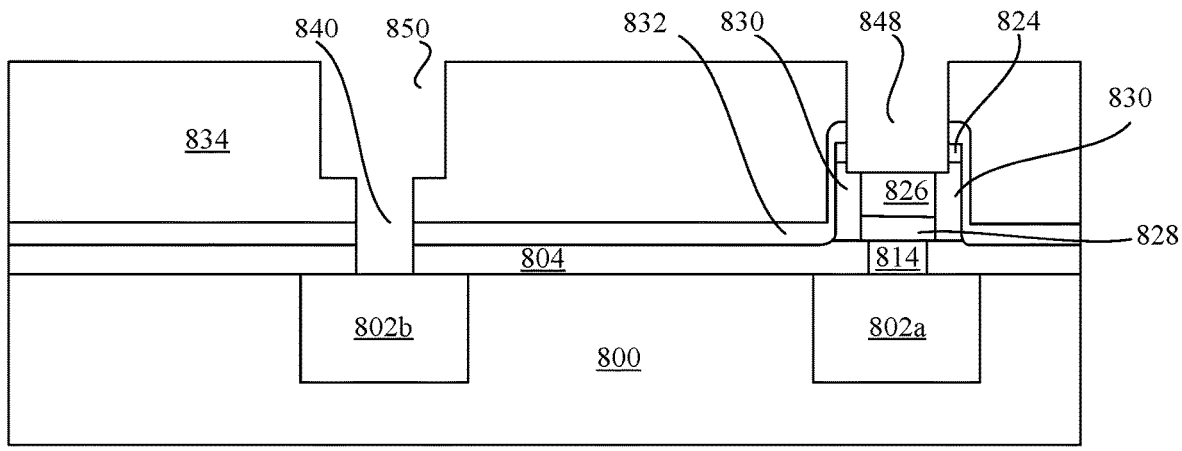
Figure 8W:
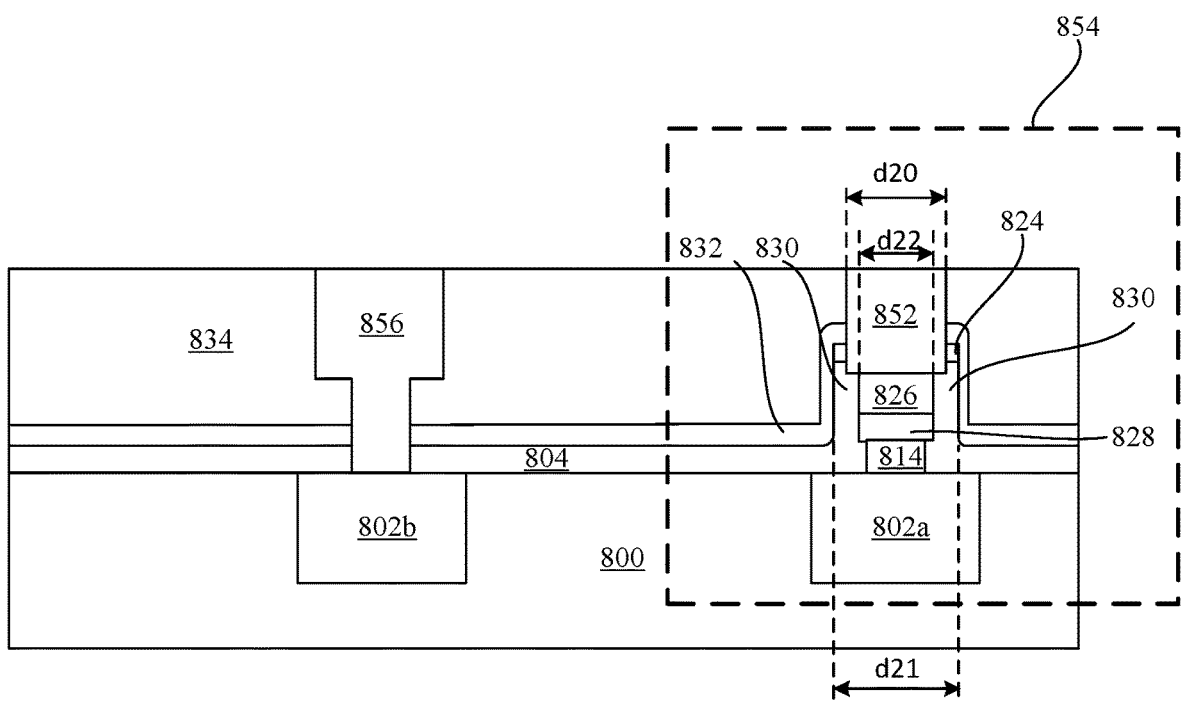

With reference to FIG. 8V, a second via hole 848 is formed using the opening 844 of the photoresist 842. The second via hole penetrates the insulating layer 834, the side wall layer 932 on the second dielectric layer 824, the second dielectric layer 824 to reach a surface of the top electrode 826. Further, a third via hole 850 is formed using the opening 846 of the photoresist 842. The third via hole 850 coincides with the trench 840 and has a width greater than a wide of the trench 840. The photoresist 842 is then stripped from the substrate 800. Referring now to FIG. 8W, A metal layer is then deposited on the substrate 800, filling the second via hole 848, the third via hole 850, and the trench

840. A CMP process is performed to remove extra metal layer from the insulating layer 834 to form the top contact lines 852 for the memory cell 854 and a contact wiring 856 to the metal line 802*b*.

As shown in FIG. 8W, the top contact line 852 is formed such that a width d20 of the top contact line 852 is less than a width d21 between lateral outer surfaces of the side portions 830. The width d20 of the top contact line 852 is formed to be greater than a width d22 of the top electrode 826. The lateral/side surfaces of the top electrode 826 and the resistive layer 828 are covered with the insulating side portions 830, which reduce the possibility of a short circuit between the top contact line 852 and the resistive layer 828. Further, the bottom electrode 814 is embedded in the first via hole 810 of the first dielectric layer 804, which reduces the possibility of a short circuit between the top contact line 852 and the bottom electrode 814. Moreover, the side portions 830 that cover the lateral/side surfaces of the resistive layer 828 effectively prohibit oxygen diffusion from the resistive layer 828 into other portion of the memory cell 854. These structures improve the performance and reliability of the memory cell 854.

It is to be understood that the embodiments illustrated in FIGS. 8A-8W are examples. One of ordinary skill in the art would understand that the methods, processes, and steps may be modified to a various degree without departing from the spirit of this disclosure.

While examples and features of disclosed principles are described herein, modifications, adaptations, and other implementations are possible without departing from the spirit and scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

What is claimed is:

1. A non-volatile memory cell comprising:
a bottom electrode;
a top electrode having a conductive material;
a resistive layer interposed between the bottom electrode and the top electrode;
side portions covering sides of the top electrode and the resistive layer, the side portions including an oxide of the conductive material; and
a contact wire disposed on the top electrode,
wherein a width of the contact wire is less than a width between lateral outer surfaces of the side portions, and
wherein a portion of a bottom surface of the contact wire and a portion of lateral surfaces of the contact wire are in contact with the side portions.

2. The non-volatile memory cell of claim 1, further comprising:
an insulating layer disposed on the side portions; and
side walls covering the outer surfaces of the side portions and the insulating layer,
wherein the lateral surfaces of the contact wire are in contact with the insulating layer and the side walls.

3. The non-volatile memory cell of claim 1, wherein:
the width of the contact wire is greater than a width of the top electrode.

4. The non-volatile memory cell of claim 1, wherein:
the bottom electrode includes at least one of TiN, TaN, or W.

5. The non-volatile memory cell of claim 1, wherein:
the top electrode includes at least one of TiN, TaN, Ru, Pt, Ir, or W.

6. The non-volatile memory cell of claim 1, wherein:
the resistive layer includes a metal oxide.

7. The non-volatile memory cell of claim 1, wherein:
the resistive layer includes a first film and a second film disposed on the first film, the second film being different from the first film.

8. The non-volatile memory cell of claim 7, wherein:
the first film includes a first metal oxide; and
the second film includes a second metal oxide.

9. The non-volatile memory cell of claim 1, wherein:
the side portions further include an oxide of the resistive layer.

10. The non-volatile memory cell of claim 1, wherein:
the bottom electrode is disposed in a via hole and connected to a metal line.

11. A non-volatile memory cell comprising:
a bottom electrode;
a top electrode having a conductive material;
a resistive layer interposed between the bottom electrode and the top electrode;
side portions covering sides of the top electrode and the resistive layer, the side portions including an oxide of the conductive material; and
a contact wire disposed on the top electrode;
an insulating layer disposed directly on the side portions; and
side walls covering outer surfaces of the side portions and the insulating layer,
wherein lateral surfaces of the contact wire are in contact with the insulating layer and the side walls.

12. The non-volatile memory cell of claim 11, wherein:
a portion of a bottom surface of the contact wire and a portion of the lateral surfaces of the contact wire are in contact with the side portions.

13. The non-volatile memory cell of claim 11, wherein:
the width of the contact wire is greater than a width of the top electrode.

14. The non-volatile memory cell of claim 11, wherein:
the resistive layer includes a metal oxide.

15. The non-volatile memory cell of claim 11, wherein:
the resistive layer includes a first film and a second film disposed on the first film, the second film being different from the first film.

16. The non-volatile memory cell of claim 11, wherein:
the side portions further include an oxide of the resistive layer.

17. A non-volatile memory cell comprising:
a bottom electrode;
a top electrode having a conductive material;
a resistive layer interposed between the bottom electrode and the top electrode;

side portions covering sides of the top electrode and the resistive layer, the side portions including an oxide of the conductive material; and a contact wire disposed on the top electrode, wherein a width of the contact wire is less than a width between lateral outer surfaces of the side portions, wherein the width of the contact wire is greater than a total width of the top electrode, and wherein a portion of a bottom surface of the contact wire and a portion of lateral surfaces of the contact wire are in contact with the side portions.

18. The non-volatile memory cell of claim 17, further comprising:

an insulating layer disposed on the side portions; and side walls covering the outer surfaces of the side portions and the insulating layer, wherein lateral surfaces of the contact wire are in contact with the insulating layer and the side walls.

19. The non-volatile memory cell of claim 17, wherein:

the resistive layer includes a metal oxide.

\* \* \* \* \*